United States Patent [19]
Kobatake et al.

[11] Patent Number: 5,946,229
[45] Date of Patent: Aug. 31, 1999

[54] SEMICONDUCTOR DEVICE HAVING DEVICE SUPPLYING VOLTAGE HIGHER THAN POWER SUPPLY VOLTAGE

[75] Inventors: Hiroyuki Kobatake; Ichiro Kondo, both of Tokyo, Japan

[73] Assignee: NEC Corporatoin, Tokyo, Japan

[21] Appl. No.: 09/055,701

[22] Filed: Apr. 7, 1998

[30] Foreign Application Priority Data

Apr. 7, 1997 [JP] Japan .................................... 9-087943

[51] Int. Cl.$^6$ ................................................. G11C 11/34
[52] U.S. Cl. ............................................................ 365/182
[58] Field of Search .............................. 365/182, 185.23, 365/189.09, 230.06; 257/296, 393, 394

[56] References Cited

U.S. PATENT DOCUMENTS

| | | | |
|---|---|---|---|
| 4,156,939 | 5/1979 | Takemae et al. | 365/182 |
| 4,492,973 | 1/1985 | Ogura | 357/23 |
| 5,757,717 | 5/1998 | Kondou et al. | 365/230.06 |

FOREIGN PATENT DOCUMENTS 2-3192  1/1990  Japan .

*Primary Examiner*—David Nelms
*Assistant Examiner*—Anh Phung
*Attorney, Agent, or Firm*—Sughrue, Mion, Zinn, Macpeak & Seas, PLLC

[57] ABSTRACT

The present invention provides a semiconductor device with small space factor, which controls the application of voltages higher than a power supply voltage to internal circuits. This device includes a first transistor provided with a semiconductor substrate of one conductive type, a first region of second conductivity type formed in the semiconductor substrate, a second region of the second conductivity type formed independent of the first region, a third region of the first conductivity type formed in the first region, and a fourth region of the first conductivity type formed in the first region independent of the third region, having the first region as its back gate, and a second transistor provided with a fifth region of the first conductivity type formed in the second region and a sixth region of the first conductivity type formed in the second region independent of the fifth region, having the second region as its back gate, wherein a back gate bias voltage higher than the power supply voltage applied to the second region is applied to the first region.

8 Claims, 11 Drawing Sheets

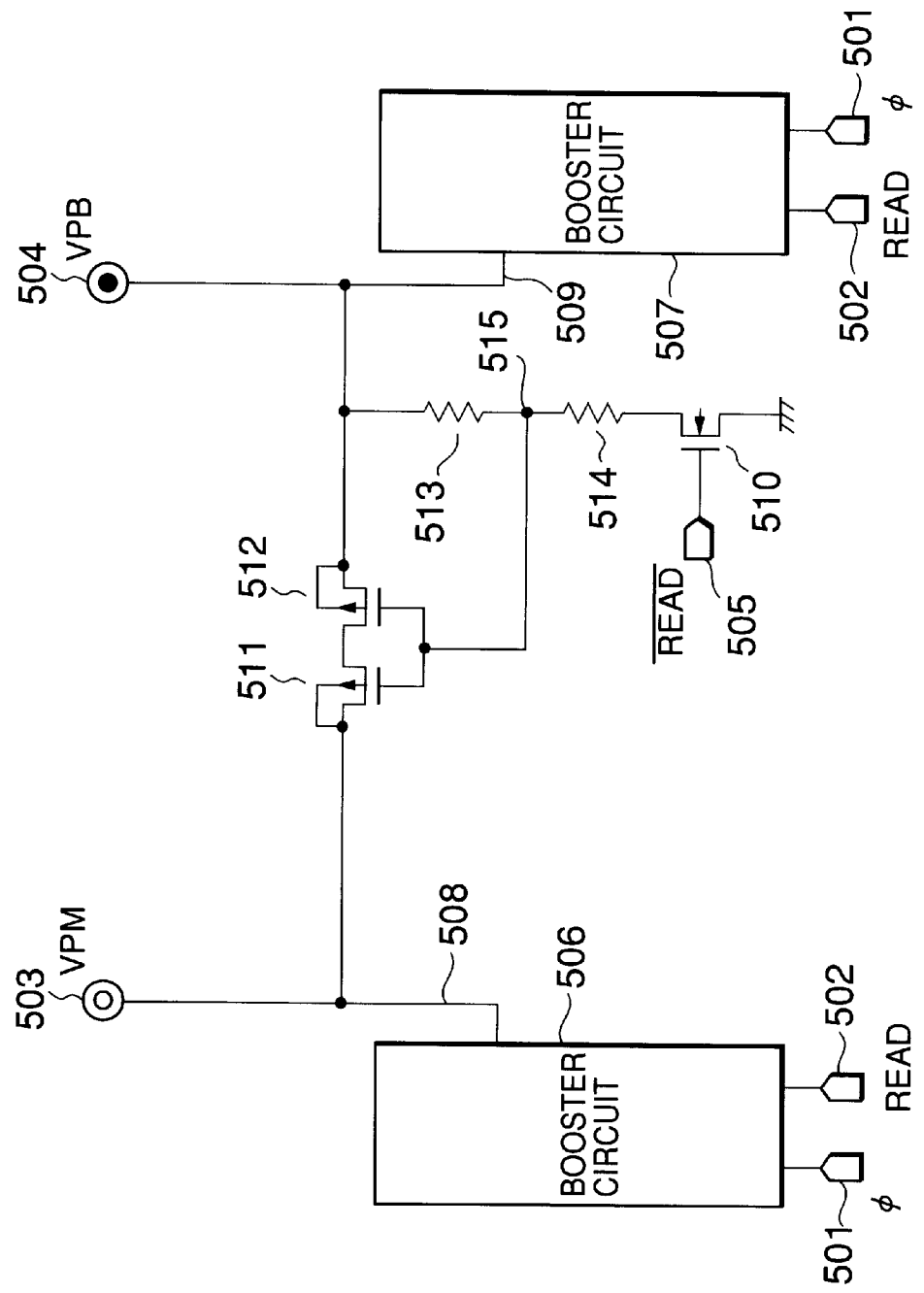

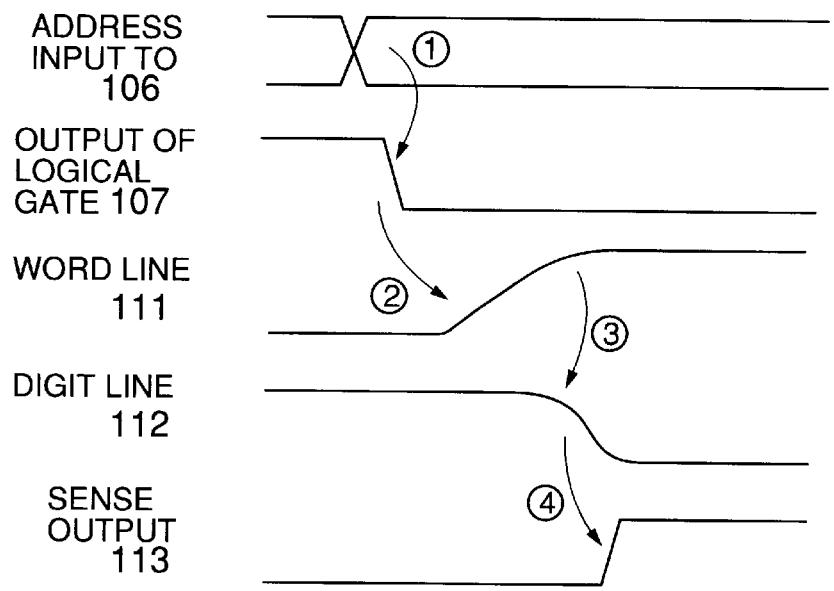
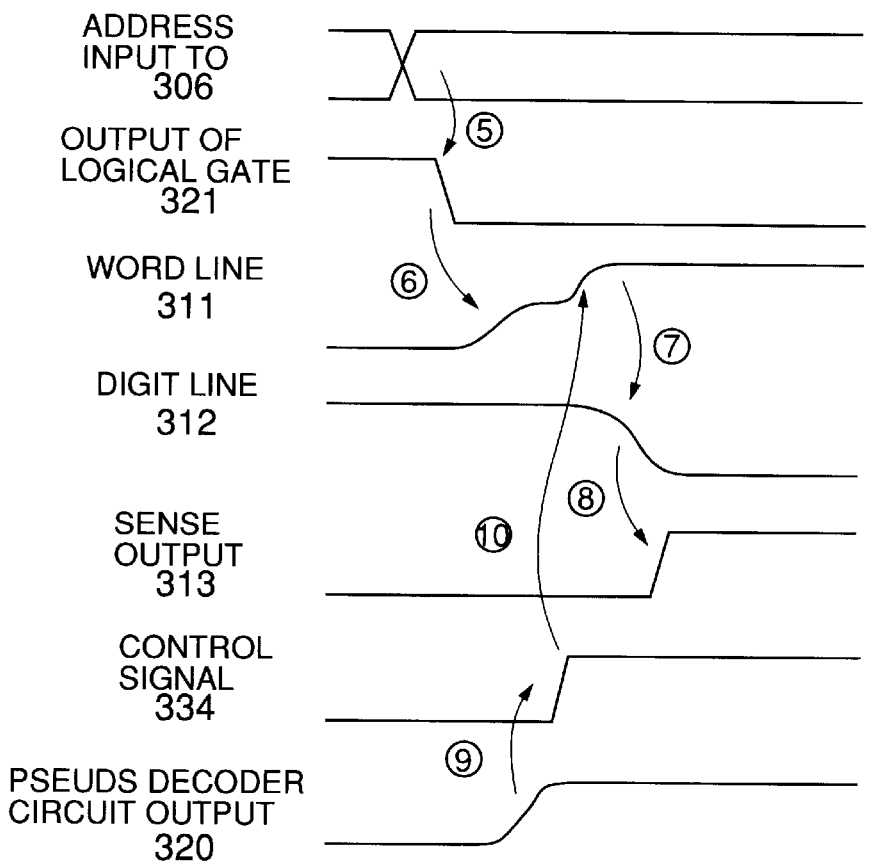

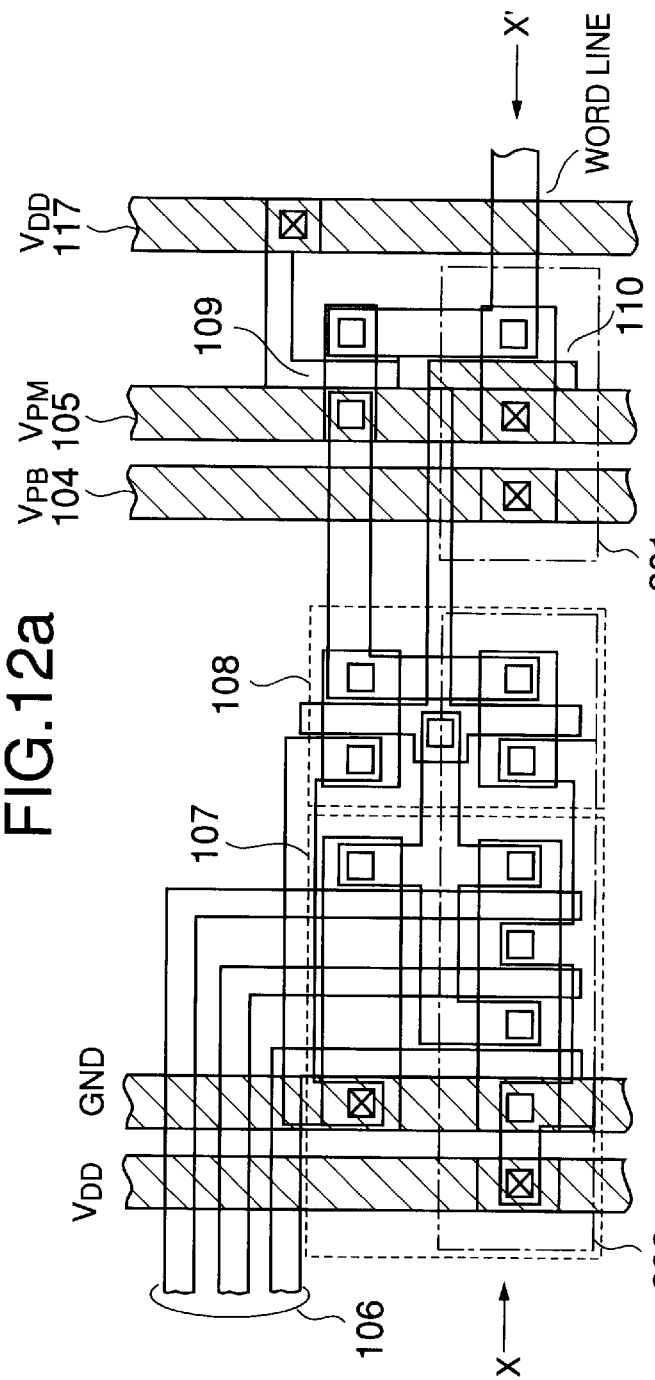
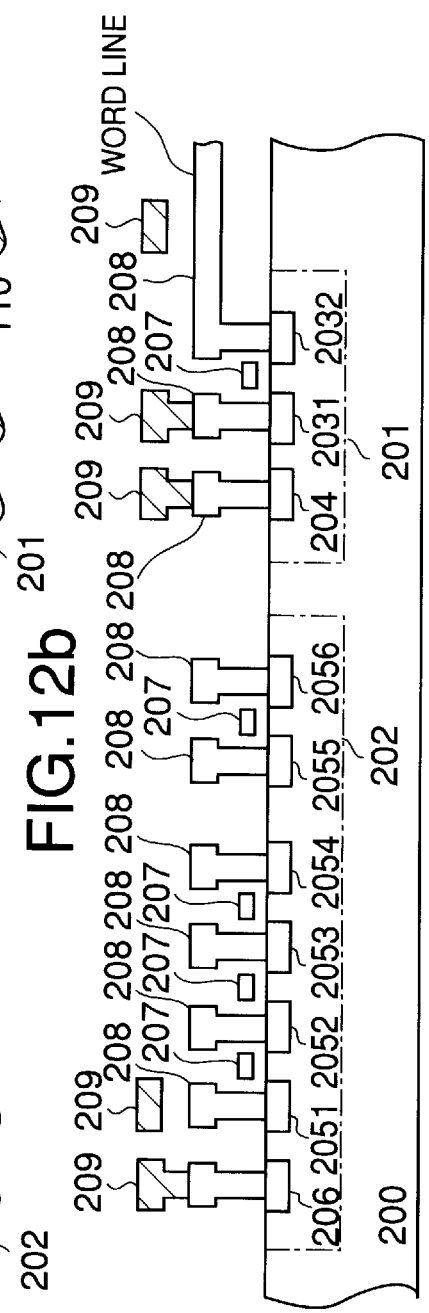

SEMICONDUCTOR DEVICE HAVING DEVICE SUPPLYING VOLTAGE HIGHER THAN POWER SUPPLY VOLTAGE

BACKGROUND OF THE INVENTION

1. Field of the Invention

The present invention relates to a semiconductor device, and more particularly, to a semiconductor device including device supplying voltages higher than a power supply voltage to an internal circuit.

2. Description of the Related Art

In recent years, demand for the low power consumption of semiconductor circuits is becoming increasingly severe, and the level of the employed power supply voltage is being reduced accordingly. In the meantime, the operating speed of the transistors in the semiconductor circuits is lowered with the reduction in the operating voltage. Consequently, portions of the circuits where a particularly high speed operation is required are frequently operated with voltages obtained by boosting the power supply voltage. For example, when the read voltage applied to the gate of a transistor constituting the memory cell is reduced depending on the power supply voltage, the read rate is reduced accordingly. A means for resolving such a problem is disclosed in Japanese Patent Laid-open No. Hei 2-3192. Referring to FIG. 10, this conventional method will be described in detail.

A decoder circuit 901 employed in a flash EEPROM comprises a selection circuit, a voltage isolation circuit, and a charging circuit.

The selection circuit comprises a NAND gate 907, a NOT gate 908, and N-channel MOS transistors 949 and 950. The NAND gate 907 receives an address 906, its output is connected to the NOT gate 908 and the gate terminal of the N-channel MOS transistor 950, and the output of the NOT gate 908 is connected to the gate terminal of the N-channel MOS transistor 949. An address 947 is input to the drain terminal of the N-channel MOS transistor 949, and the junction of the source terminal of the N-channel MOS transistor 949 and the drain terminal of the N-channel MOS transistor 950 is served as the output of the selection circuit.

The voltage isolation circuit is formed of an N-channel MOS transistor 909, its gate terminal is connected to a power supply 917, its source terminal is connected to the output of the selection circuit, and its drain terminal is served as the output of the voltage isolation circuit.

The charging circuit comprises N-channel MOS transistors 942 and 943, and capacitors C0 and C1. A terminal 948 supplies a charging voltage Vpp, and a terminal 946 which supplies a clock φ for write charging is connected to one end of the capacitor C1 and the source terminal of an N-channel MOS transistor 942. An N-channel MOS transistor 949 is connected to one end of the capacitor C0, the source terminal of an N-channel MOS transistor 943, and the output of the voltage isolation circuit, where the source terminal of the transistor 943 is served as the output of the decoder circuit 901.

The charging voltage Vpp is generated from the power supply voltage by means of a booster circuit. An example of the booster circuit is shown in FIG. 6. In this booster circuit, N-channel MOS transistors 606, and 608, with their respective gate terminals and drain terminals connected separately, are connected in series, and one ends of capacitors 607 are connected to the drain terminals of the respective transistors 606 while the other ends of the capacitors 607 are alternately supplied with clocks generated stepwise, via logical gates 609, 610, and 611, from the clock φ supplied through a terminal 601. The charging voltage Vpp is generated from the power supply voltage by controlling the output voltage 603 of the series connection of the transistors 606 and 608 with the output of the series connection of N-channel MOS transistors 605. It is to be noted that the charging circuit is activated when a signal READ supplied to a terminal 602 is at a logically high level "H".

Returning to FIG. 10, the outputs of respective decoder circuits are connected to corresponding word lines X0 and Xn of a memory array 902 formed by arranging memory cells 914 in an array form. The source terminals of all transistors in the memory array 902 are connected in common to a terminal 939 to be supplied with a voltage Vs. The columns of the memory array 902 are connected to a sense amplifier 903 as digit lines D0 to Dm, and the storage contents of the memory cells are output as a sense output 913.

Next, referring to FIG. 11, the operation of the device in FIG. 10 will be described.

When all the inputs to the NAND gate 907 go to the power supply voltage with the changes in the address 906, the output of the gate 907 goes to the ground potential (FIG. 11①), and in response to this the output of the NOT gate 908 goes to the power supply voltage (FIG. 11②). Then, the N-channel MOS transistor 950 is deenergized, and the N-channel MOS transistor 949 is energized. In addition, since the address 947 is at "H" by being selected, a word line 911 is charged up to Vdd-Vtn 909 via an N-channel MOS transistor 909, where Vdd is the voltage of the power supply 917 and Vtn 909 is the threshold voltage of the N-channel MOS transistor 909 (FIGS. 11③ and 11④). After this, when a high voltage pulse is given by a change in the charging voltage Vpp, the potential of the word line 911 is raised by C0/(C0+CE)*Vpp from Vdd-Vtn 909 (FIG. 11⑤), where CE is the parasitic capacitance of the word line 911. As a result, the potential of a digit line 912 is changed by the storage contents of a memory cell selected due to the address change (FIG. 11⑥), and the potential of the digit line 912 detected and amplified by the sense amplifier 903 is output to the sense output 913 (FIG. 11⑦). Since the voltage higher than the power supply voltage can be applied to the word line as in the above, it is possible to obtain a sufficiently high current in the memory cell and improve the operating speed of the memory even when the power supply voltage Vdd is low. Moreover, even when the power supply voltage is lower than the threshold voltage of the memory cell, it is possible to correctly read the storage contents.

However, the conventional technique described above has a problem in that in giving a voltage higher than the power supply voltage to the word line, the high voltage pulse generated from the power supply voltage by means of the booster circuit is output to the terminal 948 in FIG. 10. Namely, the pulse supplied to the terminal 948 in FIG. 10 has to charge and discharge the parasitic capacitance of the terminal 948 for each rise and fall of the pulse is decreased, which results in the reduction of the read rate of data from the memory cells. In order to prevent such a reduction in the read rate it is necessary to use a booster circuit having a large current supply capability to charge the terminal 948 rapidly to the voltage Vpp. Since the booster circuit carries out voltage step-up by transferring the charge by means of the capacitors and the clocks, capacitors with large capacitances are required for the booster circuit in order to realize a booster circuit with high current driving capability. That is, a booster circuit having a large current supply capability causes an increase in the occupied area on the semiconductor substrate. This problem is the more conspicuous as the power supply voltage becomes lower.

Moreover, since the potential of the selected word line is boosted by means of a coupling capacitor, it is necessary to provide the capacitor C0 to all the word lines, which results in an increased area on the semiconductor substrate.

Furthermore, the voltage of the boosted word line becomes Vpp+(Vdd-Vtn). Consequently, even if one manages to get a voltage Vpp which is independent of the power supply voltage Vdd, the boosted voltage will eventually be dependent upon Vdd according to the above expression. In addition, the power supply voltage Vdd fluctuates due to the noises generated by the operation of other circuits, so that the voltage supplied to the word line also fluctuates, which becomes the cause of the malfunctions.

SUMMARY OF THE INVENTION

It is therefore the object of the present invention to provide a semiconductor device with small space factor and enables a high speed operation.

The semiconductor device according to this invention comprises a first transistor which includes a semiconductor substrate of first conductivity type, a first region of second conductivity type formed in the semiconductor substrate, a second region of the second conductivity type formed independent of the first region, and a third region of the first conductivity type formed in the first region and a fourth region of the first conductivity type formed in the first region independent of the third region, and utilizes the first region as its back gate, and a second transistor which includes a fifth region of the first conductivity type formed in the second region and a sixth region of the first conductivity type formed in the second region independent of the fifth region, and utilizes the second region as its back gate, wherein a back gate bias voltage higher than the power supply voltage applied to the second region is applied to the first region.

In this invention, the threshold voltage of the first transistor is raised by supplying a back gate bias voltage to its back gate. By raising the threshold voltage, it is possible to boost the charging voltage, being a first voltage, supplied to the word line via the transistor to a level higher than that of the power supply voltage without changing the voltage amplitude of the "H" level of the signal input to the gate terminal of the transistor. In other words, it is possible to control the application of the charging voltage to the internal circuits by the mere application of a voltage ranging from that of the ground potential to the power supply voltage to the gate of the transistor.

BRIEF DESCRIPTION OF THE DRAWINGS

The above and other objects, advantages, and features of the present invention will be more apparent from the following description of the invention take in conjunction with the accompanying drawings, in which:

FIG. 5 is a circuit diagram for generating a charging voltage VPM and a back gate bias voltage VPB;

FIG. 7 is a timing chart showing the operation of the first embodiment of the invention;

FIG. 8 is a timing chart showing the operation of the second embodiment of the invention;

FIG. 12(a) is a layout pattern of the decoder circuit in the first embodiment of the invention, and FIG. 12(b) is a sectional view of the decoder circuit in the first embodiment of the invention.

DESCRIPTION OF THE PREFERRED EMBODIMENTS

Figure 1:
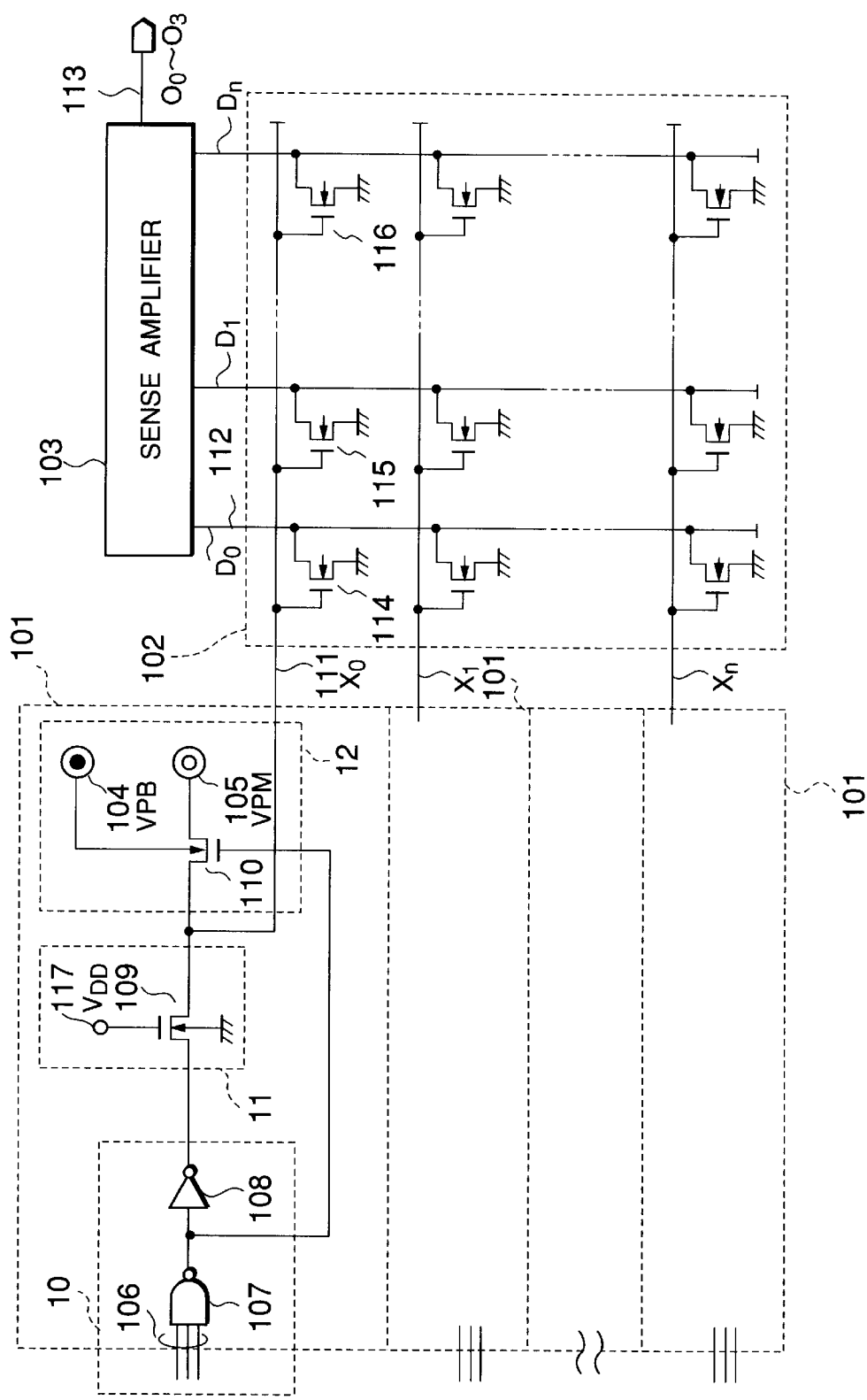
FIG. 1 is a circuit diagram of the semiconductor circuit according to a first embodiment of the invention.

Next, referring to the drawings, the embodiments of this invention will be described in detail.

First, an example of application of this invention to a read-only memory (ROM) will be described by reference to FIG. 1, and the timing chart of its operation will be shown in FIG. 7.

The semiconductor memory of a first embodiment includes a selection circuit 10, a voltage isolation circuit 11, and a charging circuit 12.

The selection circuit 10 comprises a NAND gate 107 which receives an address 106 and operates under a power supply voltage Vdd, and a NOT gate 108 which operates by receiving the output of the gate 107.

The voltage isolation circuit 11 is formed of an N-channel MOS transistor 109 which always receives the power supply voltage Vdd to its gate terminal as a control signal, has its back gate connected to the ground potential, one end of its source-drain path connected to the output of the selection circuit and its the other end served as its output.

Figure 2:
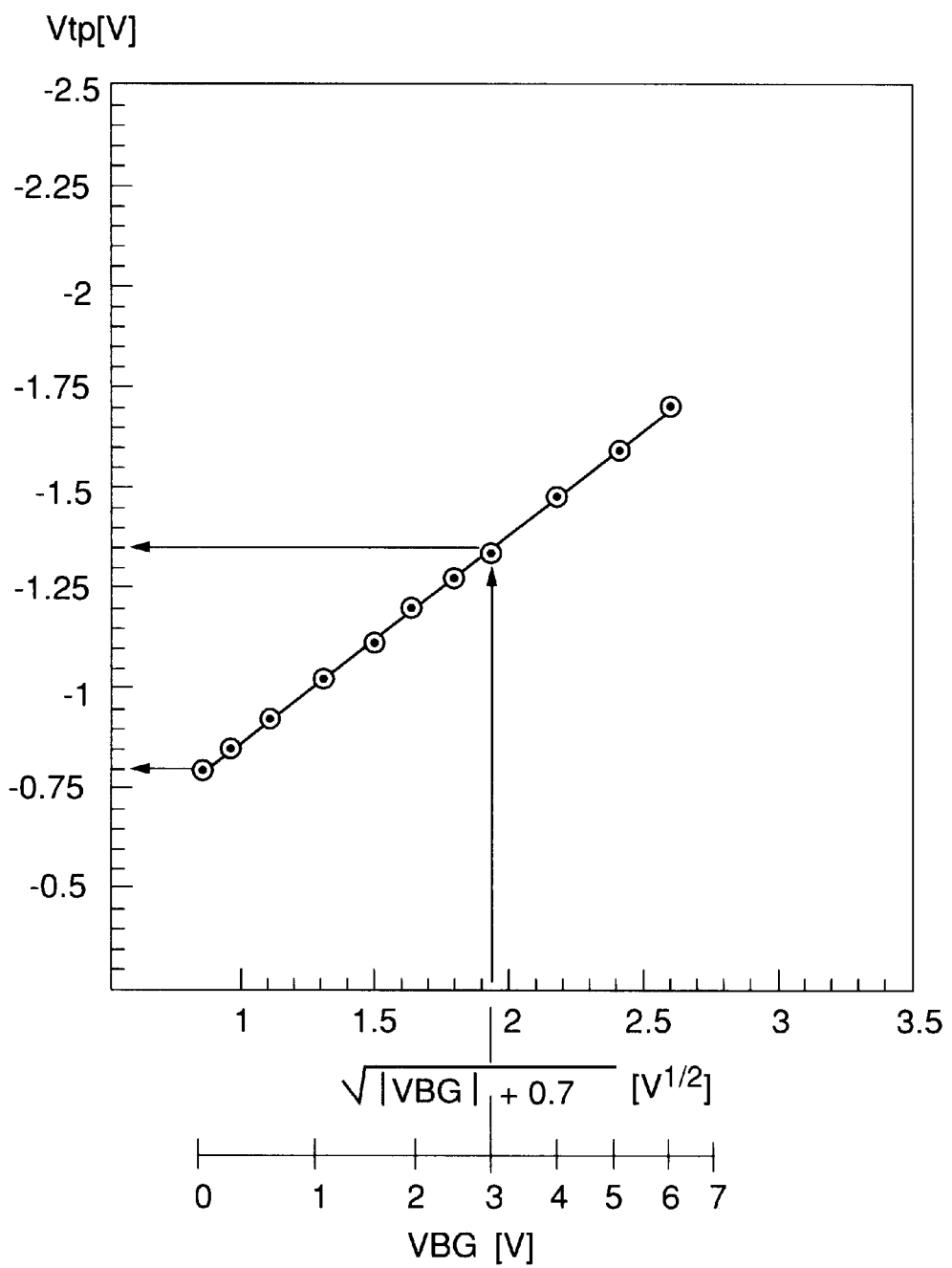
FIG. 2 is a characteristic diagram illustrating the back gate effect of a P-channel MOS transistor.

The charging circuit 12 is formed of a P-channel MOS transistor 110 with its back gate connected to a terminal 104 which supplies a back gate bias voltage VPB, its source terminal connected to a terminal 105 which supplies a charging voltage VPM, its gate terminal connected to the output of the NAND gate 107, and its drain terminal served as its output. The threshold voltage of the P-channel MOS transistor 110 is varied by the back gate bias voltage VPB applied to the back gate and the charging voltage VPM applied to the source terminal. This is caused by the so-called back gate effect which can be represented as a relation between the back gate voltage |VBG|, where VBG= VPB-VPM, taken on the abscissa and the threshold voltage Vtp taken on the ordinate, as shown in FIG. 2. In the figure, the ordinate represents the threshold voltage of the P-channel MOS transistor, but the abscissa actually represents the square root of the sum of the back gate voltage |VBG| and the initial threshold voltage 0.7[V] for easy understanding of the graph. The graph shows an approximate linear relationship. Thus, when |VBG| changes from 0 to 3[V], for example, the threshold voltage changes from −0.8[V] to −1.35[V]. As is clear from FIG. 2, the threshold voltage can be varied appropriately by varying the back gate bias voltage applied to the P-channel MOS transistor.

The output of the decoder circuit, namely, the drain terminal of the P-channel MOS transistor 110, is connected to a word line 111, and the N-channel MOS transistors 114, 115, 116, and the like arranged in an array form constitute a memory array 102. The memory cell 114 and the like are connected to a digit line 112 connected to a sense amplifier 103 which outputs in this embodiment a four-bit sense output O0–O3.

The charging voltage VPM and the back gate bias voltage VPB are supplied by a power circuit shown in FIG. 5. The power circuit comprises a booster circuit 506 which outputs the charging voltage VPM to an output end 503, a booster circuit 507 which outputs the back gate bias voltage VPB to an output end 504, P-channel MOS transistors 511 and 512 connected in series between the output ends 503 and 504, with their respective gates connected to a node 515, a resistor 513 connected between the output end 504 and the node 515, and a resistor 514 and an N-channel MOS transistor 510 connected in series between the node 515 and the ground. The operation of the booster circuits 506 and 507 is controlled by a control signal READ 502 and a clock φ. The gate terminal of the N-channel MOS transistor 510 receives the inverted signal 505 of the control signal READ. When the inverted signal 505 is in the inactive state "H", both P-channel MOS transistors 511 and 512 are energized, and output the equal voltage VPM to the output ends 503 and 504. On the contrary, when the inverted signal 505 is in the active state "L", both P-channel MOS transistors 511 and 512 are deenergized, and output the charging voltage VPM and the back gate bias voltage VPB to the output ends 503 and 504, respectively.

Next, referring to FIG. 7, the read operation will be described.

First, the case of selecting a word line corresponding to an input address signal 106 will be considered. In this embodiment it will be assumed that the power supply voltage Vdd is 3[V], the back gate bias voltage VPB is 6[V], and the charging voltage VPM is 4[V], so that the back gate voltage VBG is 6[V]−4[V]=2[V], and the threshold voltage Vtp of the P-channel MOS transistor is −1.2[V] from FIG. 2.

The output of the logical gate 107 corresponding to the selected word line changes from the power supply voltage Vdd (3[V]) to the ground potential (FIG. 7①). In response to this change, a logical gate 108 drives the word line 111 through an N-channel MOS transistor 109 (FIG. 7②). At the same time, as the output of the logical gate 107 goes to the ground potential the P-channel MOS transistor 110 is energized, and the selected word line is charged to the charging voltage VPM (4[V]) (FIG. 7②). The memory cell 114 connected to the selected word line is energized, and the digit line 112 is brought to the ground potential through the memory transistor (FIG. 7③). The sense amplifier 103 detects and amplifies the potential change in the digit line 112, and outputs data based on the data of the memory cell 114 as a sense output 113 (FIG. 7④).

Next, for a word line not selected by the input address signal, the output of the logical gate 107 goes to the power supply voltage Vdd (3[V]), and the power supply voltage Vdd is applied to the gate terminal of the P-channel MOS transistor 110. Here, the changing voltage VPM of 4[V] is supplied to one end of the source-drain path of the P-channel MOS transistor 110. Accordingly, the P-channel MOS transistor 110 will be energized if the absolute value of its threshold voltage Vtp is smaller than |−1[V]|. However, a back gate bias voltage VPB of 6[V] is applied to the back gate of the transistor 110, so that the operating threshold voltage is −1.2[V], as mentioned above, and the transistor 110 is deenergized.

As in the above, by applying a back gate bias voltage VPB to the back gate of the P-channel MOS transistor it is possible to supply a charging voltage VPM higher than the power supply voltage Vdd only to a selected word line, and supply the ground potential to unselected word lines.

Figure 3:
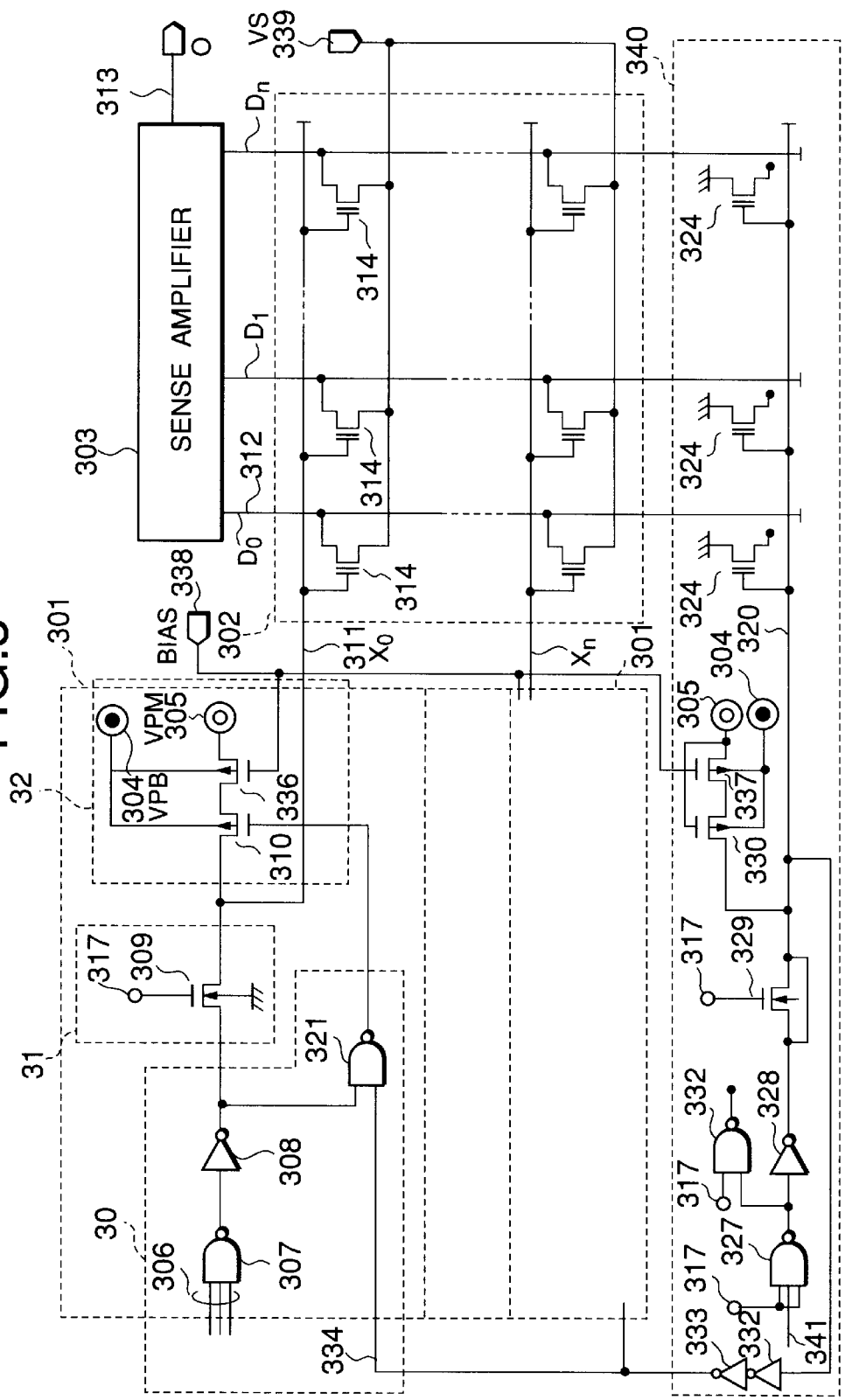
FIG. 3 is a circuit diagram of the semiconductor circuit according to a second embodiment of the invention.

As a second embodiment, the case of applying the semiconductor memory of this invention to a flash memory is shown in FIG. 3, and a timing chart of its operation is shown in FIG. 7.

The decoder circuit of this embodiment comprises a selection circuit 30, a voltage isolation circuit 31, and a charging circuit 32.

The selection circuit 30 which receives an address 106 comprises a NAND gate 307 which operates under the power supply voltage Vdd, a NOT gate 308 which operates by receiving the output of the gate 307, and a NAND gate 321 which receives the output of the NOT gate 308 to one of its inputs.

The voltage isolation circuit 31 is formed of an N-channel MOS transistor 309 which receives a power supply voltage Vdd to its gate terminal as a control signal, has its back gate connected to the ground, and one end of its source-drain path connected to the output of the NOT gate 308 and the other end served as the output.

The charging circuit 32 comprises a P-channel MOS transistor 310 with its back gate connected to a terminal 304 which supplies the back gate bias voltage VPB, its gate terminal connected to the output of the NAND gate 321, and its drain terminal served as its output, and a P-channel MOS transistor 336 with its source terminal connected to a terminal 305 which supplies the charging voltage VPM, its gate terminal connected to a terminal 338 which supplies a control signal BIAS, and its drain terminal connected to the source terminal of the P-channel MOS transistor 310.

Figure 4A:
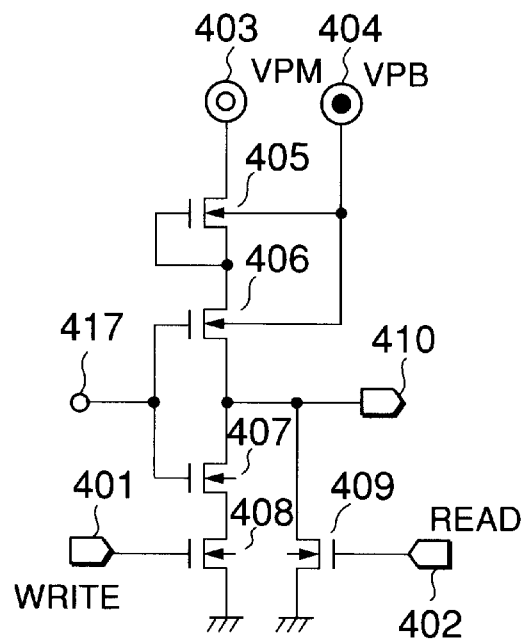
FIG. 4(a) is a circuit diagram of a control signal BIAS circuit.
Figure 4B:
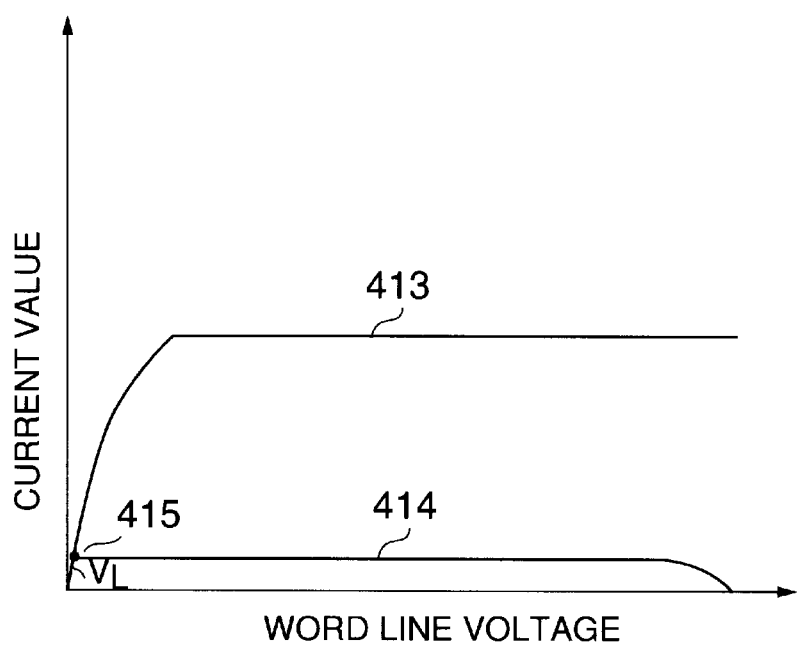
FIG. 4(b) is a characteristic diagram of the word line voltage during write operation.

Here, the control signal BIAS is generated by a circuit shown in FIG. 4(a). This circuit consists of a P-channel MOS transistor 405 with its source terminal connected to a terminal 403, and its gate terminal and drain terminal mutually connected, a P-channel MOS transistor 406 with its gate terminal connected to a terminal 417 to which the power supply voltage Vdd is applied, its source terminal connected to the drain terminal of the transistor 405, and its drain terminal connected to an output terminal 410, an N-channel MOS transistor 409 with its gate terminal connected to a control signal READ 402, its source terminal connected to the ground potential, and its drain terminal connected to the output terminal 410, an N-channel MOS transistor 408 with its gate terminal connected to a terminal 401 which supplies a control signal WRITE and its source terminal connected to the ground potential, and an N-channel MOS transistor 407 with its gate terminal connected to the terminal 417, its drain terminal connected to the output terminal 410, and its source terminal connected to the drain terminal of the transistor 408, where the potential of the output terminal 410 is output as the control signal BIAS. During the read operation, the control signal READ 402 goes to the power supply voltage Vdd and the control signal WRITE 401 goes to the ground potential, so that the N-channel MOS transistor 409 is energized and the P-channel MOS transistor 406 is deenergized. As a result, during the read operation, the output terminal 410, namely, the control signal BIAS goes to the ground potential. During the write operation, the control signal READ 402 goes to the ground potential and the control signal WRITE 401 goes to the power supply voltage Vdd, so that the N-channel MOS transistor 409 is deenergized and the P-channel MOS transistor 406 is energized. Note, however, that during the write operation the charging voltage VPM and the back gate bias voltage VPB are made to be the same voltage VPM by the circuit in FIG. 5. Accordingly, a voltage slightly below VPM-|Vtp| is output to the output terminal 410, a selected word line is charged to the charging voltage VPM, and an unselected word line goes to a voltage VL shown by 415 in FIG. 4(b). In the figure, the curve 414 represents the current-voltage (I-V) characteristic of the P-channel MOS transistor 336, and the curve 413 equivalently represents the I-V characteristic on the NOT gate connection side of the N-channel MOS transistor 309.

The output of the decoder circuit thus configured, namely, the drain terminal of the P-channel MOS transistor 310, is connected to a word line 311, and the N-channel MOS transistors 314 and the like arranged in an array form constitute a memory array 302. The N-channel MOS transistors are connected to digit lines 312 and the like, which are connected to a sense amplifier 303 which generates a sense output 313.

Here, a delay circuit 340 will be described. The delay circuit 340 comprises a pseudo decoder circuit, a pseudo memory array, and NOT gates 332 and 333 which receive the output of the pseudo decoder.

The pseudo decoder circuit comprises a pseudo selection circuit, a pseudo voltage isolation circuit, and a pseudo charging circuit. Here, the output of the delay circuit 340 is connected to a pseudo word line 320, which is connected to a pseudo memory array consisting of N-channel MOS transistors 324 arranged in an array form.

The pseudo selection circuit comprises a NAND gate 327 which receives a control signal 341 synchronized with a change in the address signal 306 and operate under the power supply voltage Vdd, a NOT gate 328 which operates by receiving the output of the gate 327, and a NAND gate 331 which receives the output of the NOT gate 328 to one of its inputs.

The pseudo voltage isolation circuit is formed of an N-channel MOS transistor 329 which receives the power supply voltage Vdd to its gate terminal as a control signal, receives the ground potential to its back gate, connects one end of the source-drain path to the output of the pseudo selection circuit, and serves the other end as its output, with its source and drain terminals short-circuited.

The pseudo charging circuit comprises a P-channel MOS transistor 330 with its back gate connected to the terminal 304 and its gate terminal connected to the terminal 338, and its drain terminal served as its output, and a P-channel MOS transistor 337 with its source terminal connected to the terminal 305, its gate terminal connected to the output of the transistor 321, and its drain terminal connected to the drain terminal of the P-channel MOS. transistor 330.

The output of the pseudo decoder circuit thus configured, used as the output of the delay circuit 340, is input via the NOT gates 332 and 333 to the other end of the NAND gate 321 of the selection circuit 30 of the decoder circuit. As a result, a delay time substantially equal to the driving time of the word line is obtained by means of the delay circuit 340.

Next, referring to FIG. 8, the read operation of the circuit will be described.

First, the case in which a word line corresponding to an input address signal 306 is selected will be considered. It will be assumed in this embodiment as before, that the power supply voltage Vdd is 3[V], the back gate bias voltage VPB is 6[V], and the charging voltage VPM is 4[V], so that the threshold voltage Vtp of the P-channel MOS transistors 310 and 336 is about −1.2[V].

The output of the logical gate 307 corresponding to the selected word line changes from the power supply voltage Vdd to the ground potential (FIG. 8⑤). In response to this change, the logical gate 308 drives the word line 311 via the N-channel MOS transistor 309 (FIG. 8⑥). When the output of the logical gate 308 goes to the power supply voltage Vdd (3[V]), the output of the NAND gate 321 goes to the ground potential delayed by the delay time of the delay circuit 340 to energize the P-channel MOS transistor 310, and the selected word line 311 is further charged to the charging voltage VPM (4[V]) (FIG. 8⑩). The memory cell 314 connected to the selected word line 311 is energized, and the digit line 312 goes to the ground potential via the memory cell 314 (FIG. 8⑦). The sense amplifier 303 detects and amplifies the potential change in the digit line 312, and outputs the result as the sense output 313.

Next, in a word line not selected by the input address signal 306, the power supply voltage Vdd (3[V]) is applied to the gate of the P-channel MOS transistor 310 since the output of the logical gate 321 goes to the power supply voltage Vdd. Accordingly, the P-channel MOS transistor 310 goes to the deenergized state similar to the first embodiment.

Since it is possible to charge the selected word line in two stages, namely, first to the power supply voltage Vdd and second to the charging voltage VPM, by providing a delay circuit, the load on the booster circuits in the power circuit can be relaxed.

Figure 6:
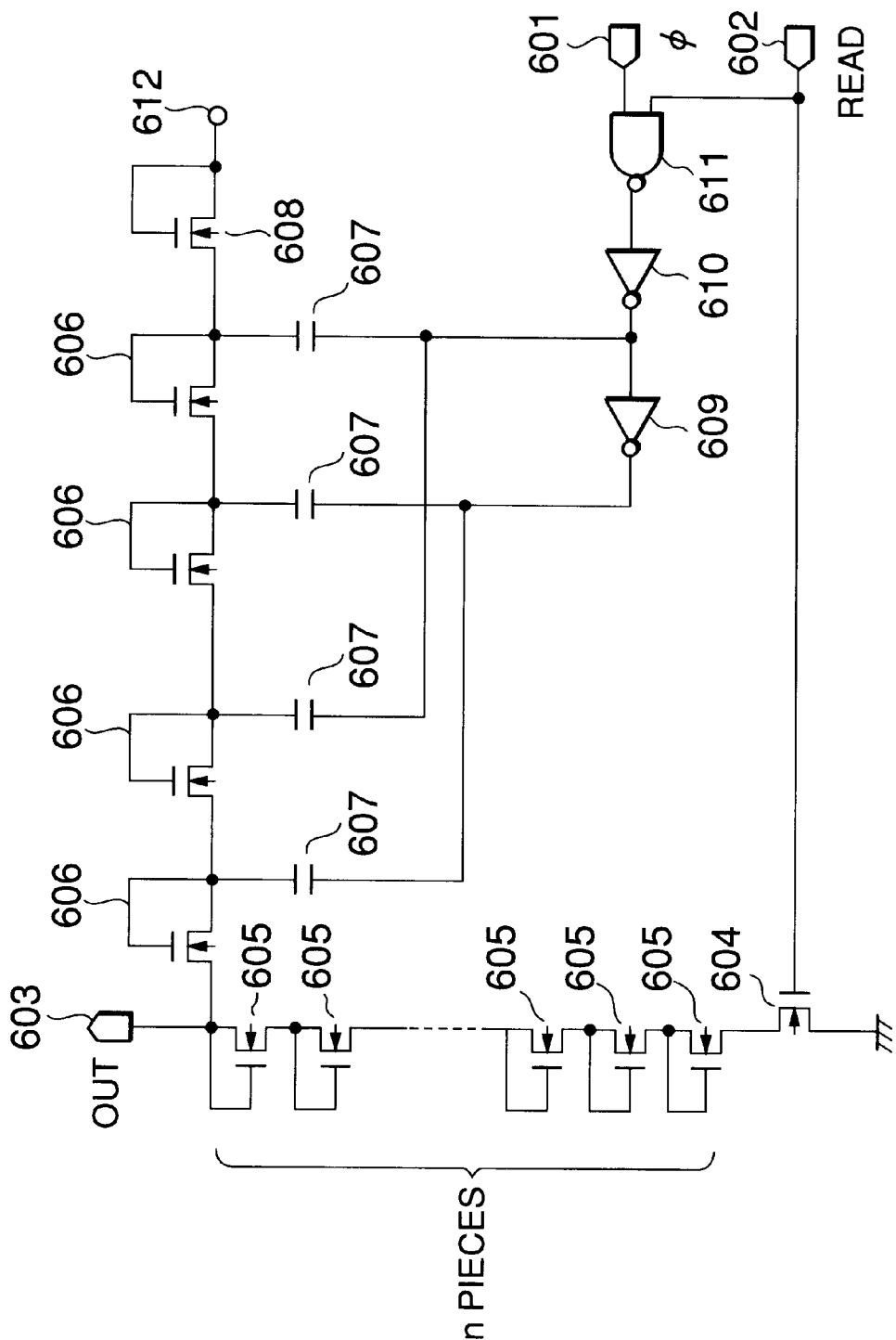
FIG. 6 is a circuit diagram of a booster circuit.

Next, in the write operation, a voltage necessary for writing, for example, 10[V] is generated in the power circuit in FIG. 6, and this voltage of 10[V] is output as the charging voltage VPM and the back gate bias voltage VPB via the booster circuit in FIG. 5. Note, however, that it will be assumed in the following discussion that it is possible to take out a plurality of different voltages from the booster circuit in carrying out write and read, although such is not indicated in the booster circuit 5 and the power circuit 6. During the write operation, the P-channel MOS transistor 336 is energized since the control signal BIAS input to the gate terminal of the P-channel MOS transistor 336 is VPM-|Vtp|, and at selection, the P-channel MOS transistor 310 which receives the ground potential to its gate terminal is also energized. As a result, the charging voltage VPM (10[V]) is applied to the selected word line 311. In this state, by applying a voltage of 10[V] to the digit line 312 to cause a current flow between the source and the drain terminals of an intended memory cell 314 for writing, it is possible to write data to the memory cell 314. In this case, a voltage is applied to the gate terminal of the P-channel MOS transistor 310 in order to avoid the application of the charging voltage VPM (10[V]) to unselected word lines.

Figure 9:
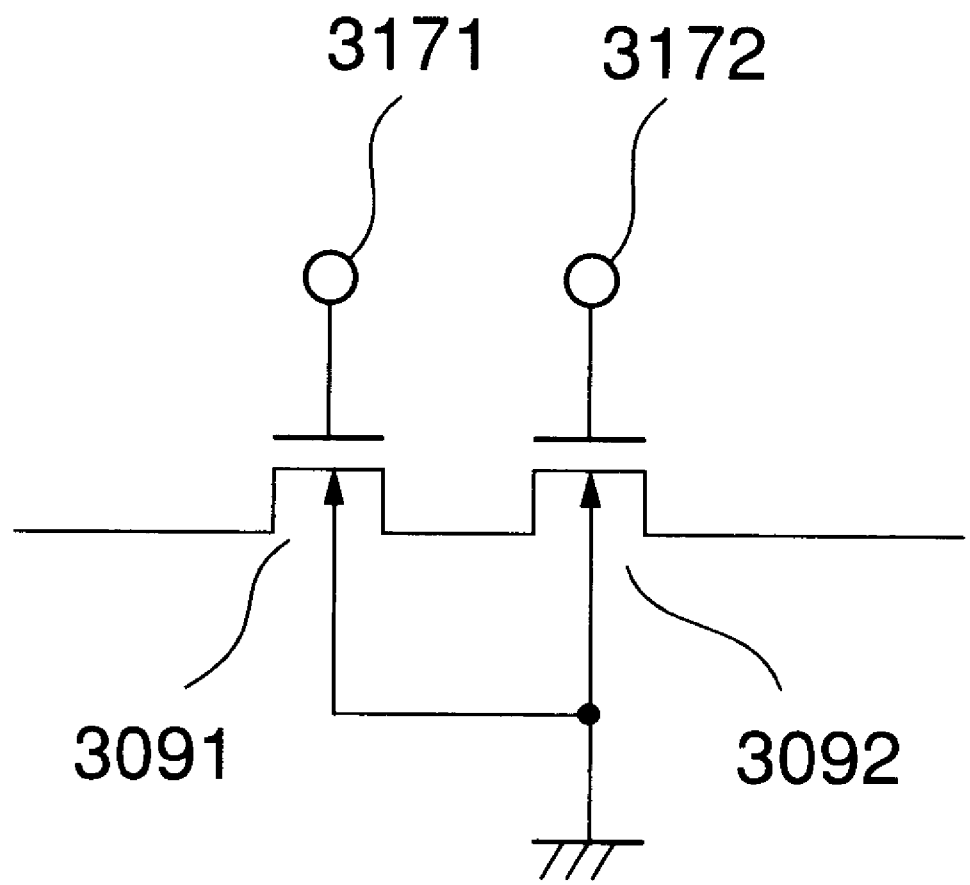
FIG. 9 is a circuit diagram of the voltage isolation diagram according to the invention.
Figure 10:
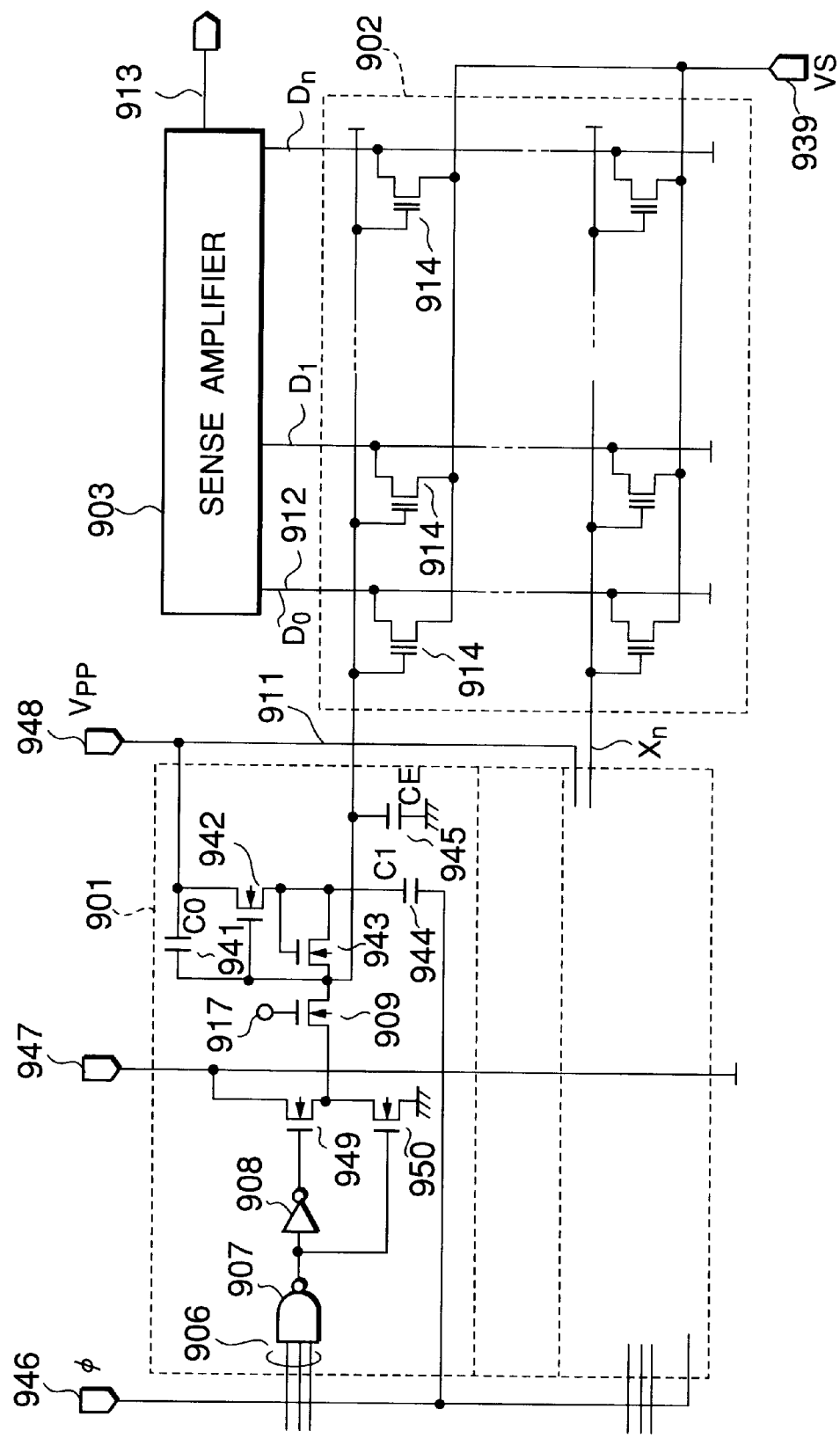
FIG. 10 is a circuit diagram of a conventional circuit.
Figure 11:
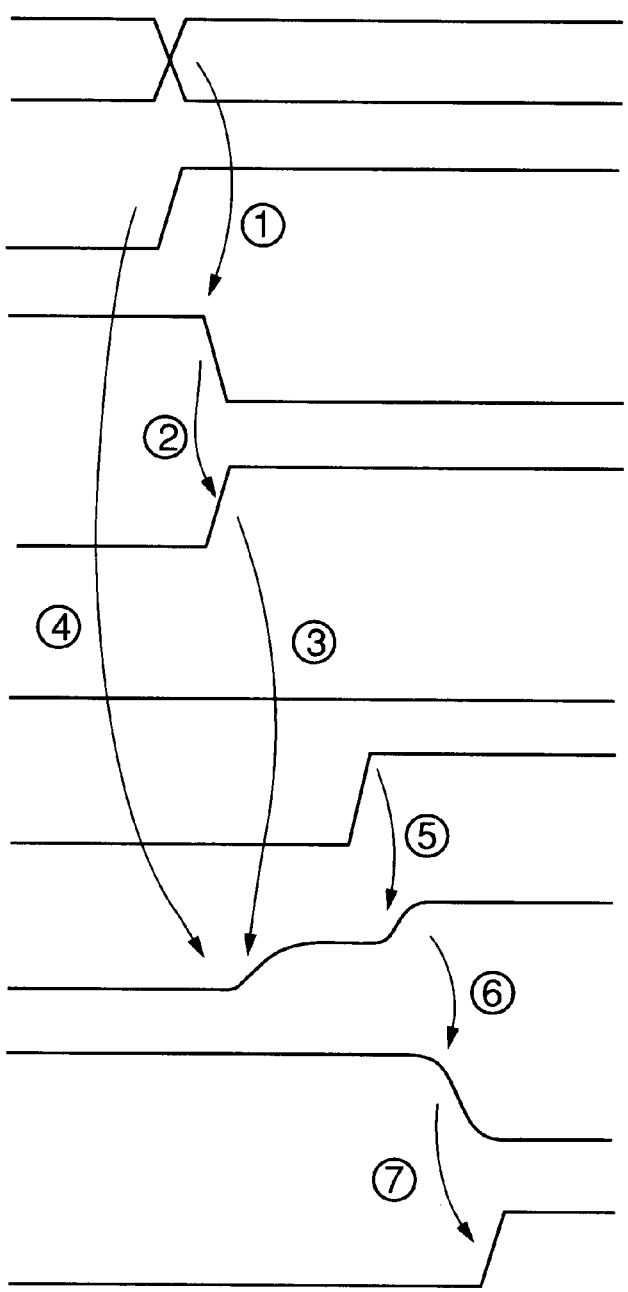
FIG. 11 is a timing chart showing the operation of the conventional circuit.

Note that when such a high voltage of 10[V] is supplied to the selected word line 311, a high voltage of {the charging voltage VPM (10[V])–the power supply voltage Vdd (3[V])}=7[V] is applied between the gate and source terminals of the N-channel MOS transistor 309. Because of this, there is a possibility of giving damages to the N-channel MOS transistor 309. In order to avoid such damages, N-channel MOS transistors 3091 and 3092 connected in series as shown in FIG. 9 may be used instead of a single N-channel MOS transistor 309, as the voltage isolation circuit 309. In this case, it will be assumed that the power supply voltage Vdd (3[V]) is applied via a terminal 3171 to the gate terminal of the N-channel MOS transistor 3191 nearer to the NOT gate 308, and a voltage 7[V] generated by the booster circuit is supplied via a terminal 3172 to the gate terminal of the N-channel MOS transistor 3092 nearer to the P-channel MOS transistor 310. As a result, the voltage difference between the source terminal (10[V]) and the gate terminal (7[V]) of the N-channel MOS transistor 3092 is only 3[V], and the voltage difference between the source terminal (7[V]-Vtn) and the gate terminal (3[V]) is only 4[V]-Vtn, where Vtn represents the threshold voltage of the N-channel MOS transistor. By employing the series connection of a plurality of transistors in place of the N-channel MOS transistor 309, as in the above, it is possible to reduce the voltage difference between the gate and source terminals of the N-channel MOS transistor 309, and prevent the break down of the N-channel MOS transistor.

FIG. 12 is a diagram showing the layout pattern of the decoder circuit 101 in the first embodiment of this invention shown in FIG. 1, where FIG. 12(a) is a plan view of the layout pattern and FIG. 12(b) is a sectional view along the line X–X' in FIG. 12(a).

FIG. 12(a) shows that the decoder circuit 101 comprises a selection circuit 10 consisting of the NAND gate 107 and the NOT gate 108 which receive powers from the power supply voltage Vdd and the ground potential GND, the N-channel MOS transistor 109 with its gate terminal supplied with the power supply voltage Vdd 117, with one end of its source-drain path connected to the output of the selection circuit and the other end served as the output of the circuit 101 (word line), and a P-channel MOS transistor 110 with its source terminal receiving the charging voltage VPM 105, its gate terminal receiving the output of the NAND gate 107, and its drain terminal connected to the output of the circuit 101 (word line).

In FIG. 12(b), 201 and 202 are N wells formed on the surface of a P-type semiconductor substrate 200, 2031 and 2032, and 2051 to 2056 are P-type diffused layers forming the source-drain path of a P-channel MOS transistor, 204 and 206 are N-type diffused layers for taking electrical connection with the N wells 201 and 202, 207 is a polysilicon layer forming the gate terminal of the transistor, and 208 and 209 are a first and second metallic wiring layers.

In FIGS. 12(a) and 12(b), the N well 201 in which is formed the P-channel MOS transistor 110 is formed isolated from other N wells (N well 202, for example), and a back gate bias voltage is applied to the N well 201 by the wiring 104 for VPB different from the wiring 105 for VPM.

In the second embodiment of this invention shown in FIG. 3, the N well in which are formed the P-channel MOS transistors 310 and 336 is also formed isolated from other N wells, and gives rise to a layout pattern in which the back gate bias voltage is applied by a wiring 304 for VPB different from the wiring 305 for VPM, so further description will be omitted.

The use of the delay circuit 340 and the NAND gate 321 employed in the second embodiment is not limited to this embodiment alone, and also be employed in the first embodiment. Moreover, the N-channel MOS transistors 3091 and 3092 can also be applied to the first embodiment depending upon, for example, the voltages to be supplied to the word lines.

As described in the above, by applying a back gate bias voltage to a MOS transistor for charging switch to raise the threshold voltage of the transistor, the need for obtaining a transistors with especially high voltage by modifying the conditions of the device can be eliminated, namely, there is no need for increasing the manufacturing manhours.

Moreover, there is no need for providing a voltage boosting capacitor for each word line, so that it is possible to increase the charging voltage of word lines with very small installation area, and improve the read rate of data from memory cells.

Furthermore, by making the voltage to be applied to the word line depends only on the charging voltage VPM, and generating the charging voltage VPM to be independent of the power supply voltage Vdd, it is possible to make the voltage applied to the word line to be unaffected by the fluctuations in the power supply voltage Vdd. Accordingly, malfunctions due to the fluctuations in the power supply voltage Vdd can be prevented.

In this way, it is possible to control the application of voltages higher than the power supply voltage to the internal circuits by means of a transistor having a back gate to which is applied a back gate bias voltage, which simplifies the circuit configuration.

In the first and second embodiments in the above, the cases where the present invention is applied to a ROM and a flash memory are illustrated. However, the present invention is not limited to these applications, and is applicable to all kinds of circuits in which application of voltages higher than the power supply voltage to the internal circuits needs be controlled. Moreover, various modifications of the embodiments are possible within the scope of the spirit of the invention.

What is claimed is:

1. A semiconductor device comprising: a first transistor consisting of a semiconductor substrate of first conductivity type, a first region of second conductivity type formed in the semiconductor substrate, a second region of said second conductivity type formed independent of said first region, and a third region of said first conductivity type formed in said first region and a fourth region of said first conductivity type formed in said first region independent of said third region, which has said first region as its back gate; and a second transistor consisting of a fifth region of said first conductivity type formed in said second region and a sixth region of said first conductivity type formed in said second region independent of said fifth region, which has said second region as its back gate; wherein a back gate bias voltage higher than a power supply voltage applied to said second region is applied to said first region.

2. The semiconductor device according to claim 1, wherein the operating threshold voltage of said first transistor is increased by said back gate bias voltage in such a way as to energize said first transistor when a logical level having a voltage lower than said power supply voltage is applied to its gate terminal, and deenergize said first transistor when a logical level having a voltage substantially equal to said power supply voltage is applied to its gate terminal.

3. The semiconductor device according to claim 2, wherein said second transistor constitutes a selection circuit which outputs a selection signal in response to an address signal, which applies a logical level with a voltage lower than said power supply voltage to the gate terminal of said first transistor when selected by said address signal, and applies a logical level with a voltage substantially equal to said power supply voltage to the gate terminal of said first transistor when not selected by said address signal.

4. In a semiconductor device provided with a decoder circuit which drives, based on address information, one word line out of a plurality of word lines to a selection level having a voltage higher than a power supply voltage and the remaining word lines to a nonselection level, the semiconductor device characterized in that said decoder circuit is provided with a selection circuit which outputs, based on address information, an activation signal when selected and an inactivation signal when not selected, and a charging circuit which drives said word line to the selection level having a voltage higher than the power supply voltage based on said activation signal and drives said word line to the nonselection level based on said inactivation signal, wherein said charging circuit consists of a plurality of first transistors with their respective source-drain paths inserted between the corresponding word lines of said plurality of word lines and the circuit points where said selection levels are supplied, which are composed of second regions of first conductivity type formed in first regions of second conductivity type formed in a semiconductor substrate of said first conductivity type and third regions of said second conductivity type formed in said first regions independent of said second regions, with said first regions as their back gates, where the respective back gates of said first transistors receive back gate bias voltages different from the voltages of said selection levels to have their operating threshold voltages raised.

5. The semiconductor device according to claim 4, wherein said charging circuit includes a second transistor composed of a fifth region of said second conductivity type formed in a fourth region of said second conductivity type provided independent of said first region in said semiconductor substrate, and a sixth region of said second conductivity type formed in said fourth region independent of said fifth region, which utilizes said fourth region as its back gate; and said decoder circuit comprises a plurality of selection circuits which supply first control signals which indicate whether said word lines are in the selection state or in the nonselection state to the gate terminals of the corresponding first transistors, and a plurality of charging circuits composed of second transistors comprising fifth region of said second conductivity type formed in fourth region of said second conductivity type provided independent of said first regions in said semiconductor substrate and sixth region of said second conductivity type formed in said fourth region independent of said fifth region, wherein when said word line is in the nonselection state, a first level of said first control signal is input to the gate terminal of said first transistor, and said back gate bias voltage is applied so as to make the result of subtraction of the voltage of said first level from the voltage of said selection level to be smaller than the operating threshold voltage regulated by said back gate bias voltage and to send said first transistor to the deenergized state, and when said word line is in the selection state, a second level of said first control signal is input to the gate terminal of said first transistor and said back gate bias voltage is applied so as to send said first transistor to the energized state.

6. The semiconductor device according to claim 4 and claim 5, wherein said decoder circuit further includes a means for outputting to a node a second control signal obtained by inverting said first control signal, and a third transistor whose source-drain path is connected between said node and said circuit point and receives said power supply voltage to its gate terminal.

7. The semiconductor device according to claim 6, wherein said decoder circuit further includes a fourth transistor connected in series with said first transistor between said circuit point and said word line, and said back gate bias voltage is applied to the back gate of said fourth transistor.

8. The semiconductor device according to claim 5, wherein said selection circuit is provided with a gate means which receives said first control signal to one end thereof and receives a third control signal to the other end thereof, and a delay circuit which generates said third control signal in response to an input signal based on a change in said address information after lapse of a specified length of time, and said first control signal is applied to said gate terminal of said first transistor when said third control signal is applied.

\* \* \* \* \*